United States Patent [19]

In Den Kleef et al.

[11] Patent Number: 4,870,361
[45] Date of Patent: Sep. 26, 1989

[54] METHOD AND APPARATUS FOR CARRYING OUT A PHASE CORRECTION IN MR ANGIOGRAPHY

[75] Inventors: Josephus J. E. In Den Kleef; Johannes P. Groen; Rudolf G. De Graaf, all of Eindhoven, Netherlands

[73] Assignee: U.S. Philips Corporation, New York, N.Y.

[21] Appl. No.: 211,727

[22] Filed: Jun. 27, 1988

[30] Foreign Application Priority Data

Jul. 13, 1987 [NL] Netherlands .................. 8701642

[51] Int. Cl.⁴ ........................................ G01R 33/20
[52] U.S. Cl. .................................. 324/309; 324/307
[58] Field of Search ............... 324/300, 306, 307, 309, 324/312; 128/653

[56] References Cited

U.S. PATENT DOCUMENTS

| 4,609,872 | 9/1986 | O'Donnell | 324/309 |
| 4,683,431 | 7/1987 | Pattany | 324/309 |
| 4,718,424 | 1/1988 | Nishimara | 324/309 |

*Primary Examiner*—Michael J. Tokar
*Attorney, Agent, or Firm*—Thomas A. Briody; Jack E. Haken; Jack D. Slobod

[57] ABSTRACT

An MR angiography method in which an angiogram is formed from the difference between amplitude and/or phase information contained in first and second complex images produced by different gradient waveforms in respective first and second types of excitation sequences. The gradient waveforms are chosen so that in the angiogram obtained from the first and second complex images, ideally, signals orginating from excited stationary spin nuclei are not present while the signals orginating from moving spin nuclei, due to flow in blood vessels, are present. However, stationary spin nuclei can be somewhat differently excited in the first and second sequence due to the different gradient waveforms used which cause different eddy currents to flow in metal parts of the apparatus. In the absence of correction, these eddy currents would exert their influence magnetically by causing a smoothly varying phase error in the difference between the first and second complex images resulting in erroneous signal contribution to the angiogram from stationary spin nuclei. This erroneous signal is eliminated by estimating the smoothly varying phase difference before forming the angiogram from the first and second complex images and by thus carrying out a non-linear phase correction.

14 Claims, 3 Drawing Sheets

METHOD AND APPARATUS FOR CARRYING OUT A PHASE CORRECTION IN MR ANGIOGRAPHY

BACKGROUND OF THE INVENTION

1. Field of the Invention

The invention relates to a method of determining a nuclear magnetization distribution or a distribution derived therefrom by subtraction of image information from images originating from a first and a second collection of resonance signals excited in a body, which is located in a stationary homogeneous magnetic field, at least comprising a first cycle of excitation sequences for producing the first collection of resonance signals, which comprises at least one high-frequency electromagnetic pulse for excitation of spin nuclei in the body and at least one magnetic field gradient superimposed on the homogeneous magnetic field, which each first sequence is repeated several times while varying the strength and/or duration of at least one magnetic field gradient, and at least comprising a second cycle of sequences for producing the second collection of resonance signals, which second sequence is repeated several times and differs from the first sequence in at least one gradient wave form for differently influencing in the first and in the second cycle moving spin nuclei and for influencing substantially equally stationary spin nuclei in the body, a first and a second complex image being formed by Fourier transformation of respective sample values of the respective resonance signals.

The invention further relates to an apparatus for determining a nuclear magnetization distribution of a body, which apparatus comprises means for producing a stationary homogeneous magnetic field, means for producing high-frequency electromagnetic pulses, means for producing magnetic field gradients, control means for the aforementioned means and processing means provided with programmed calculation means for forming complex images from sample values, which are obtained by sampling means from resonance signals produced in cycles in the body, the processing means further being provided with programmed calculation means for forming the nuclear magnetization distribution by subtraction of image information from images obtained while applying magnetic field gradients having different gradient wave forms.

2. Prior Art

Such a method for determining a nuclear magnetization distribution is particularly suitable for MR angiography, in which mostly a comparatively thick slice of the body is excited, of which, for example, a projective image of vascular trees is produced. Further, a flow speed distribution in the vessel can be determined.

Such a method is known from the article by D. G. Nishimura et al in "I.E.E.E. Transactions on Medical Imaging", Vol. MI-5, No. 3, September 1986. In FIG. 10b of the said article, as the first cycle a cycle is shown with a non-selective high-frequency electromagnetic pulse, a succeeding preparation gradient for encoding in phase in one direction the excited spin nuclei and a bipolar read-out gradient for producing a resonance signal. The bipolar read-out gradient is switched so that the phase variation caused by movement is at least substantially zero. Page 141 of the said article states the condition on which the phase of moving spin nuclei at the maximum of the resonance signals can be made equal to zero, while assuming that the spin nuclei move at a constant speed in the direction of a gradient. In order to obtain the first collection of resonance signals, the preparation gradient is varied. FIG. 10a shows a second cycle, in which the read-out gradient is switched so that the phase variation caused by movement is different from zero. Further, the second cycle is identical to the first cycle. The second collection of resonance signals is now obtained. Therefore, in the first cycle speed is compensated for while this is not the case in the second cycle. By subtraction of complex image values in images obtained from the first and second collections by Fourier transformation, an angiogram is obtained. The angiogram shows vessels in which a flow speed component in the direction of the read-out gradient had occurred. At the area of moving spin nuclei, the phase is discontinuous. The phase differences caused by movement locally occur abruptly in voxels (volume elements) comprising a part of a blood vessel. The said article further describes the dependence upon position, speed and acceleration of the phase of the MR signal in a reconstructed complex image in dependence upon the gradient wave forms, also for gradients other than the read-out gradient. In the method described, for both collections the resonance signals in the same part of a heart cycle can be measured in order to avoid movement artefacts by the use of a sensor for eensing a heart signal. It should be noted here that the sensitivity of the magnetic resonance for flow has already been known for a long time, for example from the article by Hahn in "Physical Review". Vol. 80, No. 4, 1950, p. 580–594.

A disadvantage of the known method is that the image obtained by subtraction contains, besides information about vessels or about a speed distribution over the vessel, further background information originating from signals of stationary spin nuclei. This is due to the phase difference between the signals of stationary spin nuclei in the first and second cycles. This phase difference is formed due to the different eddy currents produced by the different gradient wave forms in the first and second cycles. The eddy currents produced by switching gradients will induce a smoothly varying phase over the images. The phase varies smoothly if the body is not situated too close to metal parts, in which the eddy currents flow. In general, this condition is fulfilled. The difference in gradient wave forms will therefore result in a smoothly varying contribution to the phase difference between the first and the second complex images. This becomes manifest in the said background information of stationary spin nuclei in the image obtained by subtraction.

SUMMARY OF THE INVENTION

The invention has for its object to correct phase errors for stationary spin nuclei without disturbing the discontinuous phase differences in voxels comprising moving spin nuclei.

For this purpose, a method according to the invention is characterized in that, before the subtraction of the image information, a smoothly varying contribution to the phase difference between the first and the second image occurring due to the difference in gradient wave forms is eliminated by means of a phase correction utilizing an estimation of the smoothly varying phase difference. The smoothly varying contribution to the phase difference is generally a function varying non-linearly over the image. The fact is utilized that the phase difference due to eddy currents varies smoothly over the image and that the phase difference due to flow occurs discontinuously in voxels comprising a part of a blood vessel.

An embodiment of a method according to the invention is characterized in that a non-linear phase correction is carried out by developing the smoothly varying contribution to the phase difference between the first and the second image into a series of suitably chosen base functions, of which coefficients are determined by carrying out a weighted least-squares optimization procedure for minimizing a smoothly varying phase difference estimated with the series and the smoothly varying contribution to the phase difference between the first and the second image. The base functions are, for example, polynomes, which have previously been stored, for example, in programmed means of an MR apparatus for carrying out the method. The form of the base functions may also be determined by programmed means for information originating from the first and the second image. If the phase difference over the image becomes located outside the interval $(-\pi, \pi)$, instead of the phase difference itself, a function of the phase difference can be developed into a series of base functions. The function may be, for example, a complex exponential function of the phase difference. For an extensive description of an MR apparatus, reference may be made, for example, to an article by Locher in "Philips Technical Review", Vol. 41, 1983/84. No. 3, p. 73-88. The weighted least-squares optimization procedure according to the invention is also included in programmed means of such an apparatus. This procedure is a known least-squares procedure, which is described, for example, in the book "Practical Optimization" by P. E. Gill et al, Academic Press, London 1981.

A further embodiment of a method according to the invention is characterized in that the optimization procedure use is made of weighting factors depending upon the modulus of respective pixels (picture elements) in the first and the second image. It is advantageous to impart to pixels in the first and second image, which contain comparatively small signal values, comparatively small weighting factors in the optimization procedure in order to obtain an optimum estimation of the smoothly varying contribution to the phase difference.

A further embodiment of a method according to the invention is characterized in that in the optimization procedure such weighting factors are chosen that the disturbing influence on the phase correction in voxels having a phase influenced by moving spin nuclei is eliminated for the major part. In the case of MR angiography, this may be achieved, for example, by choosing the weighting factors with reference to the difference between the moduli of the first and second complex images. This difference will be significant for voxels comprising a part of a blood vessel.

A further embodiment of a method according to the invention is characterized in that the base functions are Chebyshev polynomes. It has been found in practice that Chebyshev polynomes yield satisfactory results.

A further embodiment of a method according to the invention is characterized in that, before the non-linear phase correction, a linear phase correction is carried out. This provides a possibility of first eliminating, in the case of great phase differences over the image, a comparatively large linear component in the phase difference for the major part, and of then eliminating the remaining phase difference with the non-linear phase correction. The linear phase variation may be estimated, for example, by determining the phase of a number of (signal) pixels or pixel groups located at a certain relative distance and by considering the intermediate phase differences as linear, or this variation may be estimated from the variation of the phase difference of the first and the second image between respective adjacent pixels. In given cases, even a linear phase correction is sufficient.

Resonance signals in the first and second cycles of the method according to the invention can be produced in different ways. In the first and second cycles, for example, echo signals with a so-called gradient echo sequence can be produced. The first and second cycles then comprise successively a high-frequency electromagnetic pulse, a magnetic preparation gradient for encoding the excited spin nuclei in phase in one direction and a read-out gradient for reading out an echo resonance signal. The method can be made sensitive to moving spin nuclei in a given direction. If in the first cycle a read-out gradient is applied, which ensures that the speed of moving spin nuclei is compensated for at the instant corresponding to the maximum of the echo resonance signal and if in the second cycle a read-out gradient is applied, for which speed compensation does not occur, after subtraction of the first and second complex images an image is obtained sensitive to moving spin nuclei in the direction of the read-out gradient. Further, preferably the speed of moving spin nuclei in the remaining gradient directions is compensated for in both the first and second sequences. In a corresponding manner, an image sensitive in the preparation direction or selection direction can be obtained.

An embodiment of a method according to the invention is characterized in that the image information of the image obtained by subtraction is formed by the modulus or amplitude of the complex image value in the pixels. Thus, an angiogram is obtained.

An embodiment of a method according to the invention is characterized in that the image information of the image obtained by subtraction is formed by phase differences in the pixels of the first and second complex images. For example, an additional bipolar gradient may be applied in the second sequence in the selection direction with respect to the first sequence in order to obtain information about flow in the selection direction. When the phase differences themselves are used as image information, a speed distribution is obtained in the direction of the applied additional bipolar gradient. By the strength of the additional bipolar gradient, a scale factor for the maximum phase difference can be adjusted so that for occurring speeds the phase difference remains within the interval $(-\pi, \pi)$. Thus, for example, in different heart phases an image of the speed of flow in the arteries can be produced, in which event flow in different directions can be indicated by a different colour.

BRIEF DESCRIPTION OF THE DRAWINGS

The invention will now be described more fully with reference to a drawing, in which.

BRIEF DESCRIPTION OF THE PREFERRED EMBODIMENTS

Figure 1:
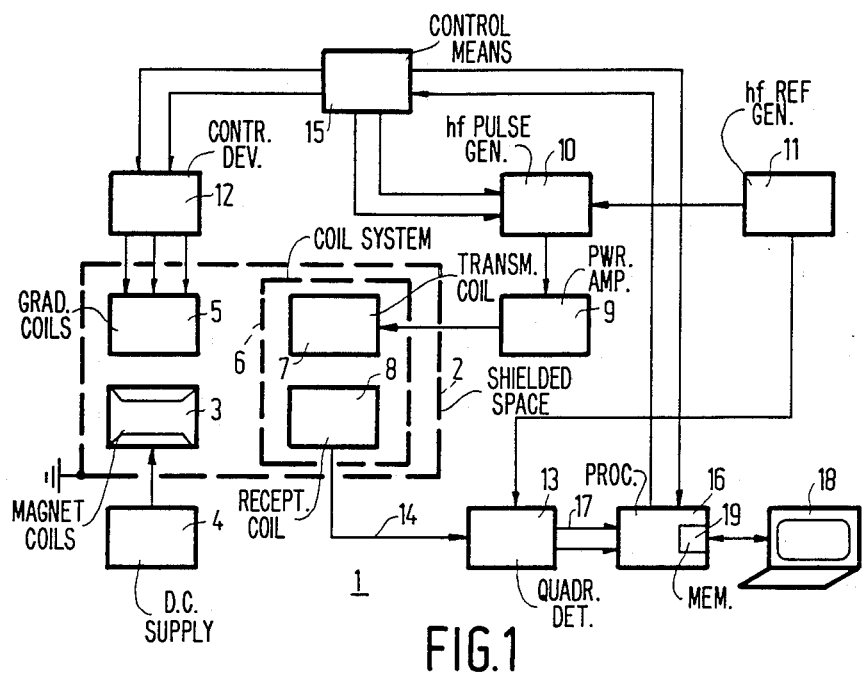
FIG. 1 shows diagrammatically an apparatus according to the invention.

FIG. 1 shows diagrammatically an apparatus 1 according to the invention, which comprises within a shielded space 2 magnet coils 3, for example supplied by a direct voltage supply 4 in the case of a resistance magnet (if the magnet coils 3 are constructed as permanent magnets or as superconducting magnets, the direct voltage supply 4 is omitted) in order to produce a stationary homogeneous magnetic field, gradient coils 5 and a transmission and reception system of coils 6 to surround, for example, the whole body of a patient (so-called body coils) as well as a transmission coil 7 and a reception coil 8. The reception coil 8 may also be a so-called surface coil for reception of signals of spin nuclei from a local region of the body. The transmission coil 7 is coupled via a high-frequency power amplifier 9 and a high-frequency generator 10 to a reference generator 11. The high-frequency generator 10 serves to produce a high-frequency electromagnetic pulse hf for excitation of spin nuclei in the body. The gradient coils 5, which are driven by a control device 12 for gradient coils, serve to produce magnetic field gradients superimposed on the stationary homogeneous magnetic field. In general, three gradients can be produced, whose field direction coincides with the direction of the stationary homogeneous magnetic field and whose respective gradient directions z, y and x are orthogonal. The magnetic field gradients are generally a selection gradient $G_z$ for selecting a slice of the body, a preparation gradient $G_y$ for encoding in phase in one direction spin nuclei and a read-out gradient $G_x$ for reading out (echo) resonance signals. By a suitable choice of the gradients, slices parallel and orthogonal as well as oblique ("oblique slices") with respect to the direction of the stationary homogeneous magnetic field can be excited. The reception coil 8, which serves to receive magnetic resonance signals of spin nuclei to be produced by the transmission coil 7 in the body, is coupled to a detector 13 for detection of the magnetic resonance signals 14 in quadrature detection. The detector 13, which is coupled to the reference generator 11, comprises lowpass filters and analog-to-digital converters for digitizing the resonance signals received and detected. Control means 15 serve for controlling and timing the high-frequency generator 10 and the control device 12 for gradient coils. Further, the apparatus 1 comprises processing means 16 for processing the digitized resonance signals 17. The processing means 16 are coupled to the control means 15. For display of images formed by programmed calculation means in the processing means 16, the processing means are further coupled to a display unit 18. The processing means 16 comprise a memory 19 for storing the programmed calculation means and for storing images and other data calculated by means of the programmed calculation means. In general, the processing means 16 are constituted by a complex computer system with many possibilities for coupling with peripheral equipment. For a more extensive description of an MR apparatus 1 and resonance measurements with the apparatus 1, reference may be made again to the said article by Locher.

Figure 2:
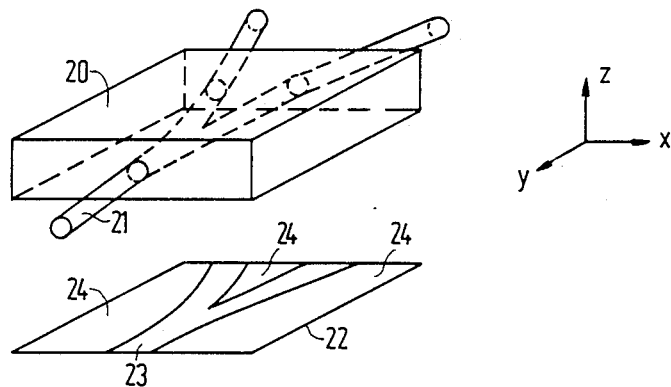
FIG. 2 shows a slice with stationary and moving spin nuclei with an image of the moving spin nuclei.

FIG. 2 shows a slice 20 with stationary and moving spin nuclei with an image of the moving spin nuclei. The moving spin nuclei are situated in vessels 21, which are, for example, veins or arteries in a body. The stationary spin nuclei are situated in the remaining part of the slice 20. By selection of a comparatively thick slice (for example 10–20 cm thick) of the body with a selection gradient $G_z$, while simultaneously transmitting with the transmission coil a high-frequency electromagnetic pulse hf, spin nuclei are excited. When, while varying magnetic field gradients, two collections of resonance signals with different gradient wave forms are measured and when complex images are reconstructed from the collections, which images are subtracted from each other in the processing means 16, for example a projective nuclear magnetization distribution is obtained. When the gradient waveforms are chosen so that for the two collections of resonance signals stationary spin nuclei are influenced equally and moving spin nuclei are influenced differently, the image of the nuclear magnetization distribution contains only pixels with information 23 about moving spin nuclei. Background information 24 of stationary spin nuclei is eliminated. A projection image thus obtained is a so-called angiogram.

Figure 3A:
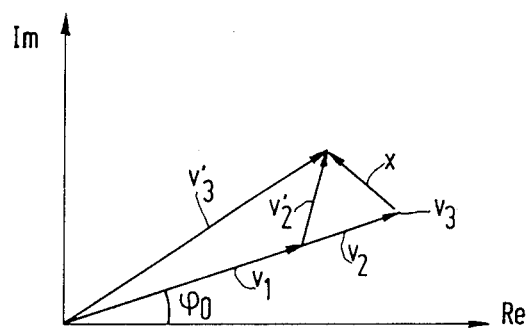
FIG. 3a is a representation of complex image information in a pixel, in which stationary and moving spin nuclei occur in an ideal situation.
Figure 3B:
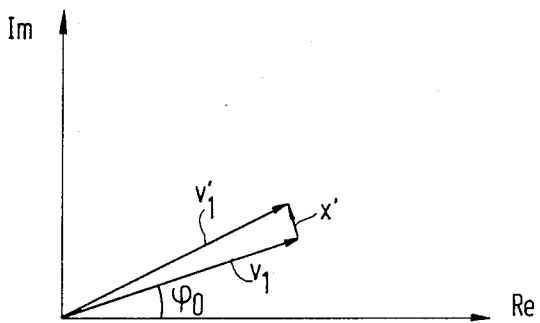
FIG. 3b is a representation of complex image information in a pixel, in which stationary spin nuclei occur in a non-ideal situation.

FIG. 3a and FIG. 3b show complex image information in a pixel. There are indicated a real axis Re and an imaginary axis Im. In FIG. 3a, it is assumed that the pixel contains information about stationary and moving spin nuclei. The information is shown in the form of a vector. When gradients are switched during the production of resonance signals, eddy currents will occur in metal parts of the MR apparatus 1. In the description of FIG. 3a, it is assumed that, in order to obtain information about moving spin nuclei, the gradient waveforms being different in different associated cycles, the influence in the different sequences of the eddy currents on phase rotation of spin nuclei is equal (ideal). The phase rotation in the pixel in a first cycle is $\phi$ for stationary and moving spin nuclei. The stationary spin nuclei are represented by a vector $v_1$ and the moving spin nuclei are represented by a vector $v_2$. The sum of $v_1$ and $v_2$ is $v_3$. By variation of a gradient wave form in a second cycle, the phase rotation of the moving spin nuclei is varied. This becomes manifest in a rotation of the vector $v_2$. In the second cycle, the moving spin nuclei are represented by a vector $v_2'$ and the resulting vector of $v_1$ and $v_2'$ is then $v_3'$. Information x about moving spins is obtained by subtraction of the vectors $v_3$ and $v_3'$, $x = v_3' - v_3$. As information in the angiogram, for example the modulus or amplitude of x may be chosen. In FIG. 3b it is assumed that the pixel contains only information about stationary spin nuclei. $v_1$ designates the stationary spin nuclei in the first sequences. Now there is started from a non-ideal situation in order to explain the influence of the eddy currents (practical situation). Due to difference in gradient wave forms in the second sequences to obtain information about moving spin nuclei (in other pixels), also the stationary spin nuclei will obtain a different phase rotation. The vector $v_1$ rotates. This is designated by $v_1'$. The difference vector $x' = v_1' - v_1$ represents information originating from stationary spin nuclei, which gets into the angiogram. The phase difference obtained due to difference in eddy currents varies smoothly over the whole image. This is due to the fact that in a practical situation the body is located at a sufficiently large distance from the metal parts in which the eddy currents flow. The resulting fields have a smooth variation over the body.

Figure 4:
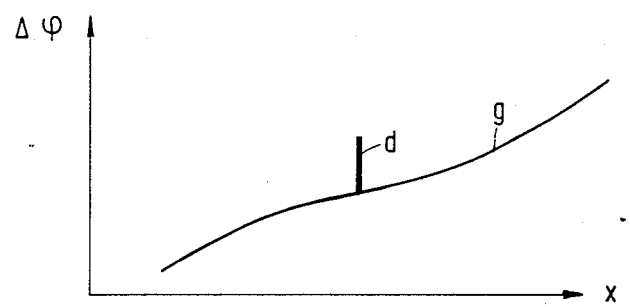
FIG. 4 shows unidimensionally a smoothly varying phase difference, in which a discontinuity occurs due to the presence of moving spin nuclei in a blood vessel.

FIG. 4 shows unidimensionally a smoothly varying phase difference, in which a discontinuity occurs due to the presence of moving spin nuclei in a blood vessel. The phase difference $\Delta\phi$ is plotted against the dimension x. The discontinuity d is superimposed on the smoothly varying phase difference g. The phase difference due to moving spin nuclei is dependent upon the speed of the spin nuclei with a suitable choice of gradient wave forms. For the description of this phenomenon, reference may again be made to the said article by Nishimura. According to the invention, the smoothly varying phase difference g is estimated and the smoothly varying phase difference g is eliminated before the subtraction of images formed from the two collections of resonance signals. The discontinuous phase difference will generally be comparatively small. The estimation should therefore be accurate. The method being embodied in programmed calculation means will be explained now more fully. The phase difference $\Delta\phi$ (in general multidimensional) between the complex images is developed into a series of base functions which vary slowly with the position in the image. For example, a bidimensional case is chosen.

$$\Delta\phi(x,y) = \text{SIGMA } c_{ij} \cdot Q_{ij}(x,y),$$

where $Q_{ij}(x,y)$ is a collection of bidimensional base functions, for example, products of polynomes P, $$Q_{ij}(x,y) = P_i(x) \cdot P_j(y)$$

SIGMA is a summation over i and j, x and y are image dimensions and $c_{ij}$ are coefficients of the development. For example, for P Chebyshev polynomes T up to the third order will be used:

$$Q_{ij}(x,y) = T_i(x) \cdot T_j(y), \qquad i+j <= 3.$$

The Chebyshev polynomes T are then determined by a recurrent relation, for which reference may be made here to "Handbook of Mathematical Functions" by M. Abramowtiz et al, p. 791, Dover Publications, New York, 1970. The coefficients $c_{ij}$ of the development are determined via a well known least-squares optimization procedure. The smoothly varying phase difference caused by eddy currents can readily be developed into the base functions. This is not the case for the discontinuous phase differences obtained due to moving spin nuclei. However, the moving spin nuclei can introduce a given error during optimization by the optimization procedure. Due to the comparatively small weight of the signal of moving spin nuclei with respect to stationary spin nuclei, this effect is small. The disturbing effect of the moving spin nuclei on the optimization procedure for the smoothly varying phase difference can be further reduced by making the weighting factors for pixels with moving spin nuclei small, for example because of the difference of the modules of the images originating from the first and second collections of resonance signals.

Figure 5A:
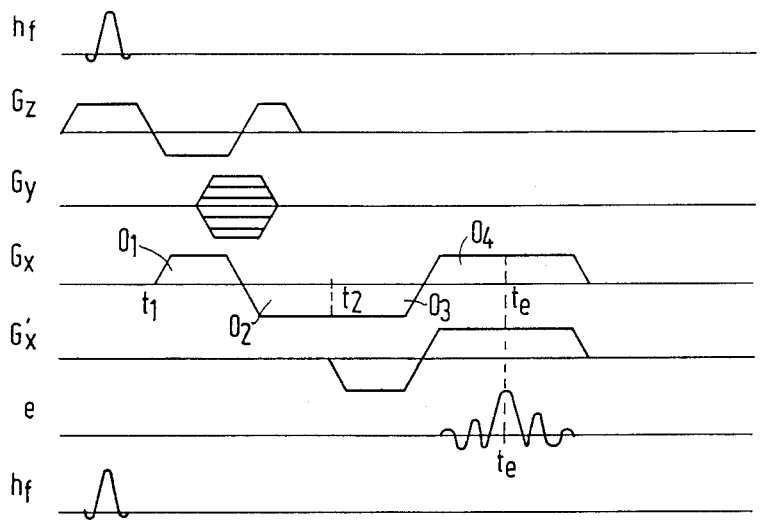
FIG. 5a shows a first and second sequence in a gradient echo experiment for influencing a speed component of moving spin nuclei in the direction of the read-out gradient.
Figure 5B:
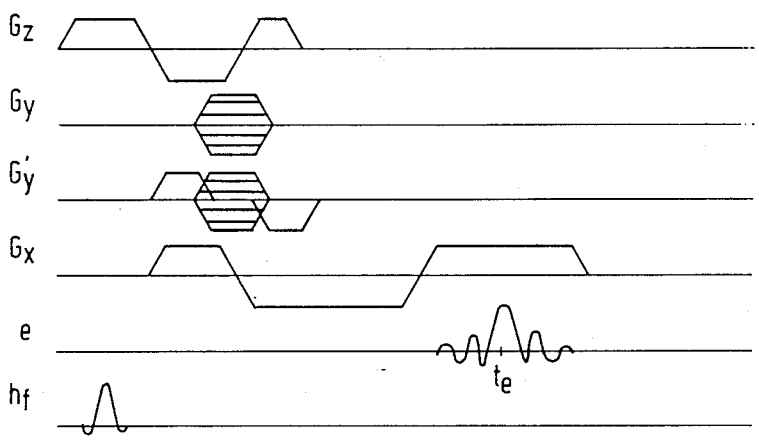
FIG. 5b shows a first and second sequences in a gradient echo experiment for influencing a speed component of moving spin nuclei in the direction of the preparation gradient.
Figure 5C:
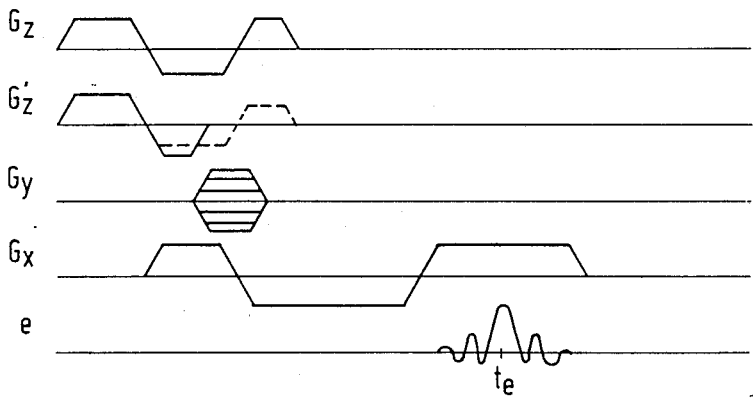
FIG. 5c shows a first and second sequences in a gradient echo experiment for influencing a speed component of moving spin nuclei in the selection gradient direction.

FIG. 5a, FIG. 5b and FIG. 5c show pulse and gradient sequences as a function of the time t as an example of an implementation of the method. A few instants are denoted by $t_1$, $t_2$ and $t_e$.

FIG. 5a shows a first and a second cycle of sequences in a gradient echo experiment for influencing a speed component of moving spin nuclei in the direction of the read-out gradient. hf denotes a high-frequency electromagnetic pulse, which is formed in the high-frequency generator 10. By switching or not switching a selection gradient $G_z$ during the pulse hf, a slice or a larger part of the body is selected. Subsequently, in the first cycle the preparation gradient $G_y$ is switched on. Finally, an echo resonance signal e is produced by $G_x$. The gradient wave form $G_x$ in the first sequence is chosen so that the phase of moving spin nuclei is zero at the instant $t_e$ at which the maximum of the echo resonance signal occurs. In the second sequence following the first sequence, a gradient $G_x'$ is switched instead of the gradient $G_x$, which causes the phase of moving spin nuclei to be different from zero at the instant $t_e$ at which the maximum of the echo resonance signal occurs. The first and second sequences, which are further identical, are repeated several times whilst varying the preparation gradient $G_y$. The resonance signals e are sampled in the detector 13. In the processing means 16, two images are formed from the sample values obtained by a Fourier transformation. The phase correction for the smoothly varying phase difference is carried out and the two complex images are subtracted from each other. The modulus of the resulting image is an angiogram without disturbing background information. The angiogram may represent, for example, a projection of vessels in which flow occurs with a speed component in the read-out direction. By $G_x$ the speed-induced phase rotation is compensated for, as a result of which no phase rotation is obtained, while $G_x'$ is causing moving spin nuclei to obtain an additional phase rotation in the direction of the read-out gradient. The speed-dependent phase rotation caused by $G_x$ between the instants $t_1$ and $t_2$ is eliminated by $G_x$ between the instants $t_2$ and $t_e$. The bipolar gradient $G_x$ between the instants $t_2$ and $t_e$ has an opposite polarity with respect to the bipolar gradient between the instants $t_1$ and $t_2$. The gradient surfaces $O_1$, $O_2$, $O_3$ and $O_4$ are equal. The remaining gradient wave forms are chosen so that speed at the instant $t_e$ is compensated for.

FIG. 5b shows a similar pulse and gradient sequence. By varying in the first and second cycles $G_X$ instead of $G_y$, an angiogram is obtained sensitive to flow in the direction of the preparation gradient.

FIG. 5c shows a first and a second cycle in a gradient echo experiment for influencing a speed component of moving spin nuclei in the direction of the selection gradient. By subtracting in phase-corrected images the phases instead of the complex image values, a speed distribution is obtained in the direction of the selection gradient. In the first and second cycles, the read-out gradient $G_x$ is switched on in order to compensate for speed of moving spin nuclei in the x direction. The speed component in the y direction with the shown preparation gradient $G_y$ is zero at $t_e$ so that this need not be compensated for. $G_z'$ can be obtained from $G_z$ by switching an additional bipolar gradient. By the strength of the additional bipolar gradient, a scale factor can be adjusted for the maximum phase difference in such a manner that for occurring speeds the maximum phase difference remains within an interval $(-\pi, \pi)$. This is indicated in FIG. 5c by a broken line. For example, with a speed distribution in arterics, the speed may be rather high in a given heart phase.

The invention is not limited to the embodiments shown, but within the scope of the invention many variations are possible for those skilled in the art. For example, many pulse and gradient sequences may be used in the method according to the invention. It is also possible to adapt the method according to the invention to sensitivity in an arbitrary direction. For example, with a third cycle deviating from the first and second cycles, resonance signals are produced for an additional first collection of resonance signals. A complex difference image is reconstructed from the first and second collections and further an additional complex difference image is reconstructed from the additional first collection and from the second collection. The complex difference image and the additional complex difference image represent, for example, respective sensitivities in the x and y direction. A combination of the two last-mentioned complex images yields an image sensitive in both directions. In a slightly modified form, the method described may also be used to eliminate a smoothly varying phase contribution to, for example water and fat images or "inversion recovery" longitudinal relaxation time $T_1$ images. In such situations, the method comprises only one cycle, which is repeated several times for different values of the preparation gradient. The first complex image is obtained by Fourier transformation from the resonance signals produced from the first sequences and the additional complex image of the first image is chosen as the second image. The estimation of the then double smoothly varying phase contribution further takes place in the manner described. By subtracting half of the estimated phase contribution from the first complex image, the smoothly varying phase contribution to a water and fat image or "inversion recovery" $T_1$ is eliminated.

What is claimed is:

1. A method of deriving a nuclear magnetization distribution of a distinct type of discontinuously distributed spin nuclei by subtraction of image information from images determined from first and a second collections of magnetic resonance signals excited in a body while eliminating differences in said image information not due to said discontinuously distributed distinct type of spin nuclei, comprising a first sequence in the form of at least one high-frequency electromagnetic pulse for excitation of spin nuclei in the body and at least one magnetic field gradient superimposed on a homogeneous magnetic field, which first sequence is repeated several times while varying the amplitude and/or duration of at least one magnetic field gradient for producing the first collection of magnetic resonance signals, and comprising a second sequence which is repeated several times for producing the second collection of magnetic resonance signals and which differs from the first sequence in at least one gradient waveform for differently influencing in the first sequence and in the second sequence said distinct type of spin nuclei and for influencing substantially equally spin nuclei in the body not of the distinct type, first and the second complex images being formed by Fourier transformation of respective sample values of the respective first and second collection of resonance signals, characterized in that, before the subtraction of information contained in said first and second complex images, a smoothly varying contribution to the phase difference between the first and the second complex images is eliminated by means of a phase correction utilizing an estimation of the smoothly varying phase difference.

2. A method as claimed in claim 1, characterized in that said phase correction comprises a non-linear phase correction carried out by developing the smoothly varying contribution to the phase difference between the first and the second image into a series of suitable chosen base functions, of which coefficients are determined by carrying out a weighted least squares optimization procedure for minimizing a smoothly varying phase difference estimated with the series and the smoothly varying contribution to the phase difference between the first and the second complex images.

3. A method as claimed in claim 1, characterized in that said phase correction comprises a non-linear phase correction carried out by developing a function of the smoothly varying contribution to the phase difference of the first and the second images into a series of suitably chosen base functions, of which coefficients are determined by carrying out a weighted least-squares optimization procedure for minimizing the difference between a function of the smoothly varying phase difference estimated with the series and a function of the smoothly varying contribution to the phase difference between the first and the second complex images.

4. A method as claimed in claim 3, characterized in that the base function is a complex exponential function of the smoothly varying phase difference.

5. A method as claimed in claim 2, 3 or 4, characterized in that in the optimization procedure weighting factors are used which depend upon the moduli of corresponding pixels of the first and the second complex images.

6. A method as claimed in claim 5, wherein said distinct type of spin nuclei are moving spin nuclei and characterized in that in the optimization procedure such weighting factors are chosen that any error in the phase difference in pixels influenced by stationary spin nuclei is substantially eliminated.

7. A method as claimed in claim 2, 3, or 4, characterized in that the base functions are Chebyshev polynomes.

8. A method as claimed in claim 1, characterized in that said phase correction comprises a linear phase correction.

9. A method as claimed in claims 2 or 3, characterized in that said phase correction comprises a linear phase correction carried out before the non-linear phase correction.

10. A method as claimed in claims 1, 2 or 3, characterized in that the image information of the image obtained by subtraction is formed by the difference of the moduli of the complex image values in the pixels of the image.

11. A method as claimed in claims 1, 2, or 3, characterized in that the image information of the image obtained by subtraction is formed by phase differences in the complex image values in the pixels of the first and the second complex image.

12. A method as claimed in claims 1, 2, or characterized in that upon variation of the duration of the magnetic preparation gradient the first and second sequences are alternately carried out.

13. An apparatus for determining a projective nuclear magnetization distribution of a body, which apparatus comprises means for producing a stationary homogeneous magnetic field, means for producing high-frequency electromagnetic pulses, means for producing magnetic field gradients, control means for the aforementioned means and processing means which are provided with programmed calculation means for forming first and second complex images from respective first and second collections of sample values, which are obtained by sampling means from magnetic resonance signals excited in the body with respective first and second excitation sequences respectively utilizing magnetic field gradients having different waveforms, the processing means further being provided with programmed calculation means for forming a nuclear magnetization distribution by subtraction of image information from the first and second complex images, characterized in that the processing means are further provided with programmed calculation means for eliminating before subtraction of the image information a smoothly varying contribution to the phase difference between the first and the second complex images occurring due to the difference in the gradient waveforms by means of a phase correction.

14. An apparatus as claimed in claim 13, characterized in that the processing means are further provided with programmed calculation means for developing the smoothly varying contribution to the phase difference in series of base functions present in the programmed calculation means and for determining coefficients of the series by means of a least-squares optimization procedure contained in the programmed calculation means for minimizng the difference between the smoothly varying contribution to the phase difference and a smoothly varying phase difference estimated with the base functions.

* * * * *